United States Patent [19]

Stahlhofen

[11] Patent Number: 5,070,001

[45] Date of Patent: Dec. 3, 1991

[54] LIGHT-SENSITIVE MIXTURE FOR PRODUCING POSITIVE OR NEGATIVE RELIEF COPIES

[75] Inventor: Paul Stahlhofen, Wiesbaden, Fed. Rep. of Germany

[73] Assignee: Hoechst Aktiengesellschaft, Frankfurt am Main, Fed. Rep. of Germany

[21] Appl. No.: 111,792

[22] Filed: Oct. 23, 1987

[30] Foreign Application Priority Data

Nov. 5, 1986 [DE] Fed. Rep. of Germany ....... 3637717

[51] Int. Cl.$^5$ ................................................. G03C 1/70
[52] U.S. Cl. ..................................... 430/281; 430/270; 430/910; 522/63; 522/142
[58] Field of Search ...................... 430/270, 818, 910; 522/63, 142

[56] References Cited

U.S. PATENT DOCUMENTS

| 4,104,070 | 8/1978 | Mortiz et al. | 96/36 |
| 4,164,421 | 8/1979 | Shinozaki et al. | 96/33 |
| 4,196,003 | 4/1980 | Watanabe | 430/193 |
| 4,411,978 | 10/1983 | Laridon et al. | 430/157 |
| 4,506,006 | 3/1985 | Ruckert | 430/325 |
| 4,581,321 | 4/1986 | Stahlhofen | 430/325 |
| 4,659,645 | 4/1987 | Frommeld et al. | 430/175 |

FOREIGN PATENT DOCUMENTS 58-28739 2/1983 Japan.

*Primary Examiner*—Jack P. Brammer
*Attorney, Agent, or Firm*—Foley & Lardner

[57] ABSTRACT

A light-sensitive mixture is disclosed which contains
a) a compound having at least one acid-cleavable C-O-C bond,
b) a compound which forms a strong acid on exposure and
c) a binder which is insoluble in water but soluble in aqueous alkaline solutions and
d) a compound having at least one polymerizable or light-crosslinkable olefinic double bond. The mixture is suitable for producing printing plates, relief copies and photoresists, becoming soluble in alkaline developers on short exposure and insoluble on prolonged exposure as a result of crosslinking.

9 Claims, No Drawings

LIGHT-SENSITIVE MIXTURE FOR PRODUCING POSITIVE OR NEGATIVE RELIEF COPIES

BACKGROUND OF THE INVENTION

The invention relates to a light-sensitive mixture and, prepared therefrom, a recording material whereby positive or, alternatively, negative relief copies of an original can be produced.

It is known that light-sensitive materials based on naphthoquinone diazides can be used in certain process steps to obtain positive or, alternatively, negative copies.

German Offenlegungsschriften No. 2,855,723 and No. 2,529,054 describe photoresist materials based on 1,2-quinone diazides for a reversal process which contain N-acyl-N'-methylethylenediamines or hydroxyethylimidazoles as additives. A similar material containing secondary or tertiary amines is described in U.S. Pat. No. 4,196,003. European Patent Application No. 133,216 describes a reversal process where the additive in the quinone diazide layer is a hexamethylolmelamine ether which acts as a thermal crosslinking agent.

All these reversal processes are based on the fact that the light decomposition products of 1,2-quinone diazides produce an insoluble reaction product on heating. This thermal curing of the exposed 1,2-quinone diazides preferably takes place in the presence of certain basic or acid additives to the light-sensitive layer. Thermal curing is also aided by the addition of crosslinking agents. However, additions of this type in general have an adverse effect on the storage stability of the layers and on certain copying properties, for example, the light sensitivity and the image contrast after exposure to light. In addition, for many purposes the temperature required for image reversal is too high or the period of heating at a lower temperature is too long.

There have also been disclosed photoresist mixtures of the positive or negative type which, in addition to a 1,2-quinone diazide, also contain negative-working light-sensitive compounds. German Offenlegungsschrift No. 2,810,463 describes such a light-sensitive recording material whose light-sensitive components comprise a 1,2-quinone diazide and a nitrone, a requirement being that the 1,2-quinone diazide used should have a higher UV absorption in the wavelength region of 350 to 400 nm and a higher absorption in the visible region above 400 nm than the nitrone used in the mixture.

A light-sensitive material of similar composition is described in German Offenlegungsschrift No. 2,457,895; it contains a 1,2-quinone diazide in admixture with a light-curable compound. The disadvantage here is that the ratio of light-curable substance to 1,2-quinone diazide compound does not display a large tolerance and needs to be set as precisely as possible for image reversal to occur as a result of different exposure times. A further disadvantage is that the exposure times, in particular for the light-curable compounds, are relatively long. Furthermore, after positive development a prolonged postexposure of the image stencil is required to confer sufficient resistance thereon. In addition, to develop the exposed layer it is necessary that different amounts of organic solvents are added to the developer.

Other positive-working light-sensitive systems have also been used for selective image reversal. German Offenlegungsschrift No. 3,151,078 describes a corresponding process using a light-sensitive material which contains a combination of an acid-cleavable compound, for example a polyacetal, with a compound which forms an acid on irradiation, for example a trichloromethyl-s-triazine. Here too it is necessary for image reversal that, before developing, the material which has been subjected to image-wise exposure be heated at an elevated temperature for a certain period.

SUMMARY OF THE INVENTION

It is an object of the present invention to provide a light-sensitive mixture which can be processed into positive or, alternatively, negative copies of an original without having to be heated in the course of processing.

It is a further object to provide a light-sensitive mixture which can be processed without the presence of non-light-sensitive substances for the purpose of image reversal.

It is yet another object of the invention to provide such a light-sensitive mixture which functions satisfactorily with comparatively short exposure times.

It is another object of the invention to provide a process for producing positive relief images using the light-sensitive mixture.

It is a further object of the invention to provide a process for producing negative relief images using the light-sensitive mixture.

In accordance with the foregoing objects, the invention provides a light-sensitive mixture which comprises
 (a) a compound having at least one acid-cleavable C—O—C bond,
 (b) a compound which forms a strong acid on exposure and
 (c) a binder which is insoluble in water but soluble in aqueous alkaline solutions, and
 (d) a compound having at least one polymerizable or light-crosslinkable olefinic double bond.

The invention further provides a light-sensitive recording material which comprises a base material and a light-sensitive layer which comprises the light-sensitive mixture.

A process for preparing positive relief images by means of a recording material conforming to the above definition comprises exposing the material under a positive original until the exposed areas of the light-sensitive layer are soluble in an aqueous alkaline developer but have not become insoluble by crosslinking or polymerization of compound (d), and thereafter washing out the exposed areas of the layer with an aqueous alkaline developer. A process for producing negative relief images by means of a recording material conforming to the definition given above comprises exposing the material under a negative original until the exposed areas have become insoluble by crosslinking or polymerization of compound (d), then exposing the entire layer without original until the uncrosslinked areas of the layer have become soluble in an aqueous alkaline developer but have not as yet become insoluble as a result of crosslinking or polymerization of compound (d), and then washing out the solubilized areas of the layer with an aqueous alkaline developer.

DESCRIPTION OF THE PREFERRED EMBODIMENTS

Suitable acid-cleavable compounds (a) include:
(A) those having at least one orthocarboxylic acid ester and/or carboxamide acetal grouping, including compounds of polymeric character and where the groupings mentioned can also appear as linking elements in the main chain or as pendant substituents, (B) oligomeric or polymeric compounds having recurring acetal and/or ketal groupings in the main chain, and (C) compounds having at least one enol ether or N-acylimino-carbonate grouping.

Acid-cleavable compounds of type (A) for use as components of light-sensitive mixtures are described at length in U.S. Pat. No. 4,101,323 and in European Patent Application No. 0,022,571; mixtures which contain compounds of type (B) are described in German Patent Nos. 2,306,248 and 2,718,254 and in U. S. Pat. No. 3,779,778; compounds of type (C) are described in European Patent Application Nos. 0,006,626 and 0,006,627.

The proportion of cleavable compound can be varied between about 4 and 50% by weight, preference being given to about 5 to 30% by weight.

Suitable light-sensitive components (b) which form strong acids on exposure are available in a large number of known compounds and mixtures, such as phosphonium, sulfonium and iodonium salts, halogen compounds and organometal/ organohalogen combinations.

The phosphonium, sulfonium and iodonium compounds mentioned are generally used in the form of their salts which are soluble in organic solvents, usually in the form of the precipitation product with complex acids such as hydroborofluoric acid, hexafluorophosphoric acid, hexafluoroantimonic acid and hexafluoroarsenic acid.

The halogen-containing light-sensitive compounds which form a hydrohalic acid can in principle be all the organic halogen compounds also known for use as photochemical free radical starters, for example, those having more than one halogen atom on a carbon atom or on an aromatic ring. Examples are described in U.S. Pat. Nos. 3,515,552, 3,536,489 and 3,779,778, German Patent No. 2,610,842 and German Offenlegungsschriften No. 2,243,621, No. 2,718,259 and No. 3,337,024. Of these compounds, preference is given to the s-triazine derivatives having 2 halomethyl groups, in particular trichloromethyl groups, and an aromatic or unsaturated substituent in the triazine nucleus, as described in German Offenlegungsschriften No. 2,718,259 and No. 3,337,024. Of similar suitability are the 2-trichloromethyl-1,3,4-oxadiazoles described in German Offenlegungsschriften No. 2,851,471 and No. 2,949,396. The action of these halogen-containing compounds can also be spectrally influenced and enhanced by known sensitizers.

Examples of suitable starters are: 4-methyl-6-trichloromethyl-2-pyrone, 4-(3,4,5-trimethoxystyryl)-6-trichloromethyl-2-pyrone, 4-(4-methoxystyryl)-6-(3,3,3-trichloropropenyl)-2-pyrone, 2-trichloromethylbenziminidazole, 2-tribromomethylquinoline, 2,4-dimethyl-1-tribromoacetylbenzene, 3-nitro-1-tribromoacetylbenzene, 4-dibromoacetylbenzoic acid, 1,4-bisdibromomethylbenzene, trisdibromomethyl-s-triazine, 2-(6-methoxynapth-2-yl)-, 2-(naphth-1-yl)-, 2-(naphth-2-yl)-, 2-(4-ethoxyethyl-naphth-1-yl)-, 2-(benzopyran-2-yl)-, 2-(4-methoxyanthrac-1-yl)-, 2(4-styrylphenyl)-, 2-(phenanthr-9-yl) -4,6-bistrichloromethyl-s-triazine and the compounds given in the Examples.

The amount of starter can likewise differ widely, depending on the chemical nature of the starter and on the composition of the layer. Favorable results are obtained with about 0.5 to 20% by weight, based on total solids, preference being given to about 1.0 to 12%. For light-sensitive layers over 0.01 mm in thickness in particular it is advisable to use a relatively small amount of acid donor.

The light-sensitive layer further contains a polymeric, water-insoluble binder (c) which is soluble in organic solvents. Since it is possible with advantage to use aqueous alkaline solutions as developers for the exposed layers and these aqueous alkaline solutions are in general preferred to developers based on organic solvents, use is made of those binders which are soluble or at least swellable in aqueous alkalis.

The nature and amount of binder can vary with the intended use; preference is given to proportions of total solids between about 30 and 90, particularly preferably about 50-80, % by weight.

The phenolic resins, in particular novolaks, which have proved of good utility with many positive copying materials have also proved particularly useful and advantageous with the materials according to the invention. They promote strong differentiation between exposed and unexposed areas of the layer during development, especially the relatively highly condensed resins having substituted phenols, for example, cresols, as formaldehyde condensation partners. The novolaks can also be modified in a conventional manner by reacting some of their hydroxyl groups with, for example, chloroacetic acid, isocyanates, epoxies or carboxylic anhydrides. Other alkali-soluble resins, such as copolymers of maleic anhydride and styrene, vinylacetate and crotonic acid, methylmethacrylate and methacrylic acid, are likewise suitable for use as binders.

In addition, it is also possible for many other resins to be present, which can be either water-soluble or, alternatively, alkali-insoluble, preferably vinyl polymers such as polyvinyl acetates, polyacrylates, polyvinyl ethers and polyvinyl pyrrolidones, which can themselves be modified by comonomers. The most favorable amount of these resins depends on the application requirements and the effect on development conditions and in general is not more than about 20% of that of the alkali-soluble resin. The light-sensitive layer can further contain, in small amounts, substances for specific requirements such as flexibility, adhesion, gloss etc., such as polyglycols, cellulose ethers, for example ethyl cellulose, wetting agents, dyes and finely divided pigments.

Preferred polymerizable or light-crosslinkable compounds (d) are those compounds whose carbon double bond is adjacent to a CO group. Examples thereof are compounds which are known as chalcones. Bis- or tris-chalcones, azidochalcones and derviatives of cinnamic acid are highly suitable for use as photocrosslinkers for the purposes of the present invention. The light-sensitive —CH=CH-CO-group can also be present in the main chain or side chain of a polymer, for example, as described in U.S. Pat. Nos. 3,030,208, 3,707,373, and U.S. Pat. No. 3,453,237 or German Offenlegungsschrift No. 1,447,016.

Photopolymerizable compounds are monomers which contain at least one, but preferably two or three, terminal double bonds in the molecule and, on irradiation with actinic light, undergo polymerization. Compounds of this type are described in U.S. Pat. Nos. 3,261,686 and 3,380,831 and in British Published Application No. 1,154,872, for example, acrylic acid esters and methacrylic acid esters of polyols, such as diethylene glycol diacrylate, diethylene glycol dimethacrylate, triethylene glycol diacrylate, triethylene glycol dimethacrylate, pentaerythritol triacrylate, pentaerythritol trimethacrylate, trimethylolpropane triacrylate, trimethylolpropane trimethacrylate, trimethylolethane triacrylate and trimethylolethane trimethacrylate.

The proportion of compound (d) in the light-sensitive layer is in general between about 2 and 30, preferably between about 4 and 20, % by weight, based on the nonvolatile constituents.

Similarly, the mixing ratio between positive-working, acid-cleavable compound (a) and negative-working, photopolymerizable or light-crosslinkable compound (d) should be within a certain range to ensure in every case that a short exposure time results in appreciable photosolubilization and an appropriately longer exposure time produces light-curing. In general, about 0.2 to 5, preferably about 0.3 to 3, parts by weight of compound (d) are used per part by weight of compound (a). However, it has been found that the mixing ratio is not particularly critical and that useful combinations can even be obtained with mixing ratios outside the stated limits, depending on the specific light-sensitivity of the particular constituents used.

Unlike existing mixtures based on 1,2-quinone diazides and photopolymerizable compounds, the mixture according to the invention requires no additional photoinitiator for the polymerization of the unsaturated compounds. On exposure to light the acid donors (b) also act as free radical formers and therefore, in general, are also effective photoinitiators. However, if light-crosslinkable compounds are used it can be advantageous to influence the spectral sensitivity in a desired manner by adding suitable sensitizers.

Finally, the light-sensitive layer may also include soluble or, alternatively, finely divided dispersible dyes and, depending on the intended use, UV absorbers. Dyes of particularly good utility are triphenylmethane dyes, in particular in the form of their carbinol bases. The most favorable mixing ratio of the components is readily determinable in a particular case.

The thickness of the light-sensitive layer depends substantially on the use intended for the material. The thickness can in general be between about 500 nm and 0.08 mm, preferably about 0.001 to 0.05 mm. In the case of printing plates and photoresist layers to be applied from solutions, layer thicknesses within the range from 0.001 to 0.01 mm are preferred.

To coat a suitable base material, the mixtures are in general dissolved in a solvent. The choice of solvent has to be adapted to the proposed coating method, the layer thickness and the drying conditions. Suitable solvents for the mixture according to the invention are ketones such as methyl ethyl ketone, chlorinated hydrocarbons such as trichloroethylene and 1,1,1-trichloroethane, alcohols such as n-propanol, ethers such as tetrahydrofuran, alcohol ethers such as ethylene glycol monoethyl ether and esters such as butyl acetate. It is also possible to use mixtures, which, in addition, can also contain solvents such as acetonitrile, dioxane, dimethylformamide or propylene glycol methyl ether for specific purposes. In principle, it is possible to use any solvent which does not react irreversibly with the components of the layer.

Suitable base materials for the light-sensitive mixtures are all the materials customarily used in the art in copying processes. Examples which may be mentioned are plastic films, insulating boards with a copper layer, mechanically or electrochemically roughened and, optionally, anodized aluminum, screen printing stencil bases, wood, ceramic, glass and silicon, the surface of which can be chemically modified, for example into silicon nitride or silicon dioxide.

Preferred bases for thick layers above 0.01 mm are plastic films which then serve as temporary bases for transfer layers. For this purpose and for color proofing films, preference is given to polyester films, for example those made of polyethylene terephthalate. However, polyolefin films such as polypropylene are likewise suitable. Base materials used for layer thicknesses below about 0.01 mm are usually metals. For offset printing plates it is possible to use mechanically or chemically roughened and, optionally, anodized aluminum which can in addition have been chemically pretreated, for example with polyvinyl phosphonic acid, silicates or phosphates, and also multimetal plates having Cu/Cr or brass/Cr as the uppermost layer. For relief printing plates, the mixtures according to the invention can be applied to zinc or magnesium plates and to their commercially available microcrystalline alloys and also to etchable plastics such as polyoxymethylene. In the case of gravure or screen printing forms the mixtures are suitable on account of their good adhesion to, and etch resistance on, copper and nickel surfaces. They can also be used as photoresists.

Coating can take place directly, or by transfer from a temporary base material, to circuit board materials which consist of insulating boards with a copper layer on either or both sides, to glass or ceramic materials which may have been pretreated to improve adhesion, and to silicon wafers.

The drying after coating can be carried out on customary apparatus under customary conditions. Temperatures around 100° C. and, for short periods up to 120° C. are withstood without loss of radiation sensitivity.

Exposure can be effected with customary light sources such as fluorescent tubes, pulsed xenon lamps, metal halide doped mercury vapor high pressure lamps and carbon arc lamps.

The layer which has been subjected to image-wise exposure can be removed in a conventional manner using the developers known for commercially available naphthoquinone diazide layers and photoresists, and the novel materials can be adapted with advantage in their copying properties to the known auxiliary agents such as developers and programmed spray development equipment. The aqueous developer solutions can contain for example alkali metal phosphates, silicates, borates or hydroxides and also wetting agents. The optimum developer will depend on the particular layer used. If desired, development can be supported mechanically.

In processing into the positive copy, the recording material according to the invention is exposed in a conventional manner, as described above, under a positive original, and the exposed areas of the layer are then washed out with an aqueous alkaline developer solution.

Negative processing comprises exposing the material under a negative original. The exposure time here, under otherwise identical conditions, corresponds to about 3 to 20 times, preferably 4 to 15 times, the time required for positive exposure. Longer exposure times are not harmful, but do not produce any additional improvement. The layer is then exposed a second time, without original, for as long as necessary to photosolubilize the acid-cleavable mixture. In this process, the areas already subjected to image-wise curing are cured still further; usually, however, there is no significant change in development properties. Thereafter, the post-exposed, uncured parts of the layer are washed out in the developer.

In addition to the pure positive copy and the pure negative copy, as described above, the material and process of the invention also make possible various advantageous combinations of the two procedures. For instance, image-wise exposure under a negative can be followed by copying a positive image into the unexposed parts of the layer. This exposes, and solubilizes, all the parts of the layer other than the image areas of the positive image and the areas previously cured in the course of the production of the negative copy. Subsequent development therefore produces a combination of a negative image with the positive image. This technique, which is known as photocomposing is advantageous in the production of printing plates which contain different image areas on one page of print, for example script and half-tone areas. Normally, all these parts of an original of a print page are mounted on a mounting film and copied together onto the printing plate. With the technique described here it is possible, in a very simple manner, subsequently to copy in further image parts, for example the half-tone image corresponding to a previously copied report. This makes possible savings in time and film material.

The light-sensitive material according to the invention is distinguished from corresponding materials whose positive component is a naphthoquinone diazide, for example materials as described in German Offenlegungsschrift No. 2,457,895, by a significantly higher light sensitivity in positive exposure. As a result it is even possible to use correspondingly more light-sensitive negative systems while still maintaining an adequate difference between positive and negative sensitivity.

With the process according to the invention for producing positive copies it is not necessary for the relief image, after it has been developed, to be postexposed for the purpose of effecting postcure and be fully cured as a result. It is surprising that, using the material according to the invention, it is possible to save this additional processing step, while with the material known from German Offenlegungsschrift No. 2,457,895, which contains 1,2-quinone diazides as positive component, such postexposure is necessary to obtain adequate resistance.

A further advantage of the process according to the invention is that development can be effected with pure aqueous solutions containing no organic solvent. This was not foreseeable insofar as positive exposure is inevitably accompanied by crosslinking or polymerization of the negative system to a minor extent to form higher molecular weight water-insoluble organic products. This is confirmed by German Offenlegungsschrift No. 2,457,895, in the examples of which development is always effected with solvent-containing developers.

The process according to the invention can be used for producing printing forms for relief, gravure and planographic printing and photoresist stencils for subtractive and additive circuit board manufacture, for the production of rotary nickel cylinders by electroplating, or for mask production in microelectronics by the lift off technique.

If to be used as printing plates, the developed plates can briefly be heated to elevated temperatures, in the same way as diazo layers are treated in British published application No. 1,154,749, to increase the durability in printing and the resistance to washout agents, correcting agents and UV-curable printing inks.

In what follows, Examples of preferred embodiments of the recording material according to the invention are described. In the Examples, parts by weight (pbw) relate to parts by volume (pbv) as the g relates to the ccm. Percentage and mixing ratios are by weight, unless otherwise stated.

EXAMPLE 1

A solution of
0.80 pbw of a polyacetal of triethylene glycol and 2-ethylbutyraldehyde,
0.40 pbw of 2,4-bis-trichloromethyl-6-(4-styrylphenyl)-s-triazine,
6.00 pbw of a cresol-formaldehyde novolak having a softening range of 105°–120° C.,
0.80 pbw of trimethylolethane triacrylate and
0.14 pbw of crystal violet in
50.00 pbw of ethylene glycol monomethyl ether and
50.00 pbw of tetrahydrofuran
was coated onto an electrochemically roughened and anodized aluminum plate. Before the light-sensitive copying layer was applied, the anodized base material had been treated with an aqueous solution of 0.1% by weight of polyvinylphosphonic acid.

The presensitized material thus produced, having a layer weight per unit area of about 2 gm/m$^2$, was subjected to image-wise exposure through a transparent positive original under a 5 kW metal halide lamp at a distance of 110 cm for 15 seconds and subsequently developed with a 4% strength aqueous sodium metasilicate solution. Those areas of the copying layer upon which the light had impinged were removed by development, leaving behind on the base material the unexposed image areas to give the printing stencil corresponding to the original. After inking with a greasy ink the positive printing plate was ready for printing.

Another sample of the same material was processed as a negative printing plate. For this purpose, the sample was exposed as described above under a negative original for 90 seconds and then post-exposed over the whole area without original for 15 seconds. Developing in the same developer as above produced the reversal image of the original.

Another processing option is the subsequent copying in (photocomposing) of line or half-tone originals on a printing plate previously subjected to image-wise exposure. For this purpose, the printing plate was for example first subjected to image-wise exposure as described above under a negative original for 90 seconds and then exposed for 15 seconds under a disposition in those areas of the layer which had been covered up by a mask during the first exposure and had not been impinged upon by the light. The printing plate thus exposed was developed without further intermediate steps, those areas of the layer exposed in the second exposure, with the exception of the areas previously cured in the course of the first exposure, becoming dissolved in the developer.

The Examples which follow specify further coating solutions which produce similar results. Unless otherwise stated, production and processing of the printing plates obtained therewith correspond to the conditions described in Example 1.

EXAMPLE 2

A solution of
0.80 pbw of the polyacetal specified in Example 1,
0.60 pbw of 2,4-bis-trichloromethyl-6-(4-ethoxy naphth-1-yl)-s-triazine,
4.80 pbw of the novolak specified in Example 1,
1.00 pbw of a chalcone prepared from acetophenone and 4-methoxybenzaldehyde and
0.07 pbw of crystal violet in
50.00 pbw of ethylene glycol monomethyl ether and
60.00 pbw of tetrahydrofuran
was coated onto an electrochemically roughened and anodized aluminum plate.

The exposure time for producing a positive printing stencil was 20 seconds, and that for producing a negative printing stencil was 100 seconds. The developer used was a 7% strength aqueous sodium metasilicate solution.

EXAMPLE 3

A solution of
0.40 pbw of a polyorthoester prepared from 7,7-bis-hydroxymethyl-5-oxanonan-1-ol and trimethyl orthoformate,
0.60 pbw of 2,4-bis-trichloromethyl-6-[4-(2-ethoxy-ethoxy)naphth-1-yl]-s-triazine,
4.80 pbw of a cresol- formaldehyde-butyraldehyde novolak having a softening range of 110°-120° C.,
1.00 pbw of piperonylideneacetophenone and
0.07 pbw of crystal violet in
40.00 pbw of ethylene glycol monomethyl ether and
50.00 pbw of tetrahydrofuran
was coated onto an electrochemically roughened and anodized aluminum plate whose surface had been treated with an aqueous solution of polyvinylphosphonic acid. The exposure time for producing a positive printing form was 20 seconds, and that for producing a negative printing form was 150 seconds. The developer used was a 7% strength aqueous sodium metasilicate solution.

EXAMPLE 4

A solution of
1.00 pbw of the polyacetal specified in Example 1,
0.60 pbw of the triazine derivative specified in Example 2,
4.80 pbw of a novolak specified in Example 1,
0.20 pbw of dicinnamylideneacetone, and
0.07 pbw of crystal violet in
50.00 pbw of ethylene glycol monomethyl ether and
60.00 pbw of tetrahydrofuran
was coated onto an electrochemically roughened and anodized aluminum plate whose surface had been treated with an aqueous solution of polyvinylphosphonic acid. The exposure time for producing a positive printing form was 40 seconds, and that for producing a negative printing form was 300 seconds. The developer used was a 7% strength aqueous sodium metasilicate solution.

EXAMPLE 5

A solution of
0.80 pbw of the polyacetal specified in Example 1,
0.40 pbw of the triazine derivative specified in Example 3,
6.00 pbw of the novolak specified in Example 1,
0.80 pbw of trimethylolethane triacrylate and
0.18 pbw of crystal violet in
50.00 pbw of ethylene glycol monomethyl ether and
50.00 pbw of tetrahydrofuran
was used to coat a transparent polyester film.

The color film thus produced is highly suitable for mounting multicolored work to a high accuracy of register. To produce a positive mounting film, the light-sensitive color proofing film was subjected to imagewise exposure through a transparent positive original under a 5 kW metal halide lamp at a distance of 110 cm for 15 seconds and was then developed with a 4% aqueous sodium metasilicate solution. Development removed those areas of the copying layer upon which the light had impinged, leaving behind on the base material the unexposed image areas to give the color stencil corresponding to the original.

To prepare a negative lay sheet, another sample of the same material was exposed as described above under a negative original for 120 seconds and then afterexposed over the whole area without original for 15 seconds. Developing in the same developer as above produced the reversal image of the original.

What is claimed is:

1. A light-sensitive mixture comprising:
   (a) a compound having at least one acid-cleavable C—O—C bond, present in an amount of 4 to 50 percent by weight, based on total solids;
   (b) a compound which forms a strong acid on exposure, present in an amount of about 0.5 to 20 percent by weight, based on total solids;
   (c) a binder which is insoluble in water but soluble in aqueous alkaline solutions, present in an amount of about 30 to 90 percent by weight, based on total solids; and
   a monomeric compound having at least one polymerizable or light-crosslinkable olefinic double bond adjacent to a CO group, present in an amount of about 2 to 30 percent by weight, based on total solids.

2. The light-sensitive mixture as claimed in claim 1, wherein the polymerizable compound (d) is an ester of acrylic or methacrylic acid.

3. The light-sensitive mixture as claimed in claim 1, wherein the light-crosslinkable compound (d) is a chalcone or a cinnamic acid derivative.

4. The light-sensitive mixture as claimed in claim 1, which contains 0.2 to 5 parts by weight of compound (d) per part by weight of compound (a).

5. The light-sensitive mixture as claimed in claim 1, wherein the compound (b) which forms a strong acid on exposure is a heterocyclic compound having at least one trihalomethyl group.

6. The light-sensitive mixture as claimed in claim 1, wherein compound (b) is an s-triazine substituted by at least one trichloromethyl group.

7. The light-sensitive mixture as claimed in claim 1, wherein binder (c) i a novolak.

8. A light-sensitive recording material comprising a base material and a light-sensitive layer comprising
   (a) a compound having at least one acid-cleavable C—O—C bond;
   (b) a compound which forms a strong acid on exposure;
   (c) a binder which is insoluble in water but soluble in aqueous alkaline solutions; and
   (d) a compound having at least one polymerizable or light-crosslinkable olefinic double bond.

9. A compound according to claim 1, consisting essentially of components a, b, c and d.

* * * * *